(12) United States Patent
Kuo et al.

(10) Patent No.: US 7,708,607 B2
(45) Date of Patent: May 4, 2010

(54) PRECISION PRINTED CIRCUIT BOARD TESTING TOOL

(75) Inventors: Po-Wen Kuo, Banciao (TW); Shun-Chi Yang, Banciao (TW)

(73) Assignee: Unitech Printed Circuit Board Corp., Taipei (TW)

(*) Notice: Subject to any disclaimer, the term of this patent is extended or adjusted under 35 U.S.C. 154(b) by 75 days.

(21) Appl. No.: 12/230,341

(22) Filed: Aug. 28, 2008

(65) Prior Publication Data

US 2010/0055995 A1 Mar. 4, 2010

(51) Int. Cl.
  *H01R 13/24* (2006.01)
(52) U.S. Cl. ...................................... 439/824
(58) Field of Classification Search ................ 439/824, 439/701, 79; 29/850, 846, 402.16; 174/261, 174/251, 256
  See application file for complete search history.

(56) References Cited

U.S. PATENT DOCUMENTS 3,981,076 A * 9/1976 Nicolas ........................ 29/836
4,711,026 A * 12/1987 Swiggett et al. ............... 29/850
4,864,723 A * 9/1989 Griffith et al. ................ 29/850
6,899,538 B2 * 5/2005 Matoba ....................... 433/114
7,351,115 B1 * 4/2008 Frizzell et al. ............... 439/701
7,500,886 B2 * 3/2009 Frizzell et al. ............... 439/701

* cited by examiner

*Primary Examiner*—Jean F Duverne
(74) *Attorney, Agent, or Firm*—Muncy, Geissler, Olds & Lowe, PLLC

(57) ABSTRACT

A precision printed circuit board testing tool includes a testing tube, having a hollow chamber for installing a second resilient element, and the testing tube being electrically connected to a second testing line; a second testing element, installed in the hollow chamber, and having a second chamber and an opening, and the second testing element being pressed against by the second resilient element; a first testing element, having an internal bushing, a first resilient element and a probe, and including a first chamber for installing the first resilient element, and the probe being installed in the first chamber and pressed against by the first resilient element, and the first testing element being electrically connected to a first testing line. The testing tool is used for testing a PCB circuit with micro resistance to prevent defectives and damages of electronic components.

15 Claims, 6 Drawing Sheets

PRECISION PRINTED CIRCUIT BOARD TESTING TOOL

BACKGROUND OF THE INVENTION

1. Field of the Invention

The present invention relates to a testing tool, and more particularly to a precision printed circuit board testing tool capable of testing a printed circuit board (PCB) circuit precisely to assure the quality of the PCB circuit before electronic component modules are inserted and assembled onto the PCB.

2. Description of the Related Art

After a conventional printed circuit board (PCB) is manufactured, the PCB usually goes through a testing procedure to test whether or not the printed circuit board is good. If a defective printed circuit board is not detected after electronic component modules are installed onto the defective printed circuit board, circuits on the PCB cannot operate, and thus incurring a loss to printed circuit board manufacturers. Obviously, the testing operation for printed circuit boards is very important. In a conventional printed circuit board testing tool as shown in FIG. 1, a plurality of testing bases 91 are disposed on a testing machine 90, and each testing base 91 includes a plurality of testing tubes 92 and a probe 93 is installed in each testing tube 92 and pressed against by a spring 94 in the testing tube 92 and protruded out from the testing base 91. Further, the probe 93 is electrically connected to a guidance wire 95 for connecting a voltmeter (not shown in the figure). When the conventional printed circuit board testing tool is used for testing, the probe 93 is contacted with a conductive pad 101 (PAD) of a printed circuit board 100 for testing whether a circuit between the two conductive pads 101 is an open circuit (OPEN) or a short circuit (SHORT) and with a micro resistance to determine if the printed circuit board 100 is a good product or a defect.

As we all know, the design of existing printed circuit boards tends to be complicated and precise. If a testing PCB circuit is of a low resistance or a micro resistance, the resistance of guidance wires and contacts used for testing become interferences and cannot be ignored, and thus the conventional printed circuit board testing tool using a 2-wire connection for testing resistance is not accurate or precise, and causing difficulties for accurately determining whether a printed circuit board is a good item or a defect. Obviously, the prior art demands immediate attentions and feasible solutions.

In view of the foregoing shortcomings of the prior art, the inventor of the present invention based on years of experience in the related industry to conduct extensive researches and experiments, and finally developed a precision printed circuit board testing tool with better accuracy and precision to overcome the shortcoming of the prior art.

SUMMARY OF THE INVENTION

Therefore, it is a primary objective of the present invention to provide a precision printed circuit board testing tool applicable for testing a PCB circuit of a micro resistance, and providing better accuracy and precision for testing printed circuit boards, so as to overcome the shortcomings of the conventional printed circuit board testing tool that uses a two-wire connection method for testing micro resistance.

Another objective of the present invention is to provide a precision printed circuit board testing tool capable of testing a printed circuit board (PCB) circuit precisely to assure the quality of the PCB circuit before electronic component modules are inserted and assembled onto the PCB and prevent possible loss to manufacturers.

To achieve the foregoing objective, the present invention provides a precision printed circuit board testing tool, comprising: a testing tube, including a hollow chamber, and a second resilient element contained in said hollow chamber, and said testing tube being electrically coupled to a second testing line; a second testing element, installed in said hollow chamber of said testing tube, and including a second chamber and an opening, and said second testing element being pressed against by said second resilient element; and a first testing element, including an internal bushing, a first resilient element and a probe, and said internal bushing being disposed in said second chamber, and said internal bushing including a first chamber, and said first resilient element being installed in said first chamber, and said probe being installed in said first chamber and pressed against by said first resilient element, and said first testing element being electrically coupled to a first testing line.

The present invention further comprises: two tool devices, each including a testing tube electrically coupled to a second testing line; a first testing element, installed in said testing tube, and electrically coupled to a first testing line; a voltmeter, connected to said two first testing lines separately; a constant current source, connected to said two second testing line separately; a printed circuit board, comprising two conductive pads, conductively and respectively connected to said two tool devices.

To make it easier for our examiner to understand the objective of the invention, its structure, innovative features, and performance, we use preferred embodiments together with the attached drawings for the detailed description of the invention.

DETAILED DESCRIPTION OF THE PREFERRED EMBODIMENTS

The technical characteristics of the present invention will become apparent in the following detailed description of the preferred embodiments with reference to the accompanying drawings.

Figure 1:
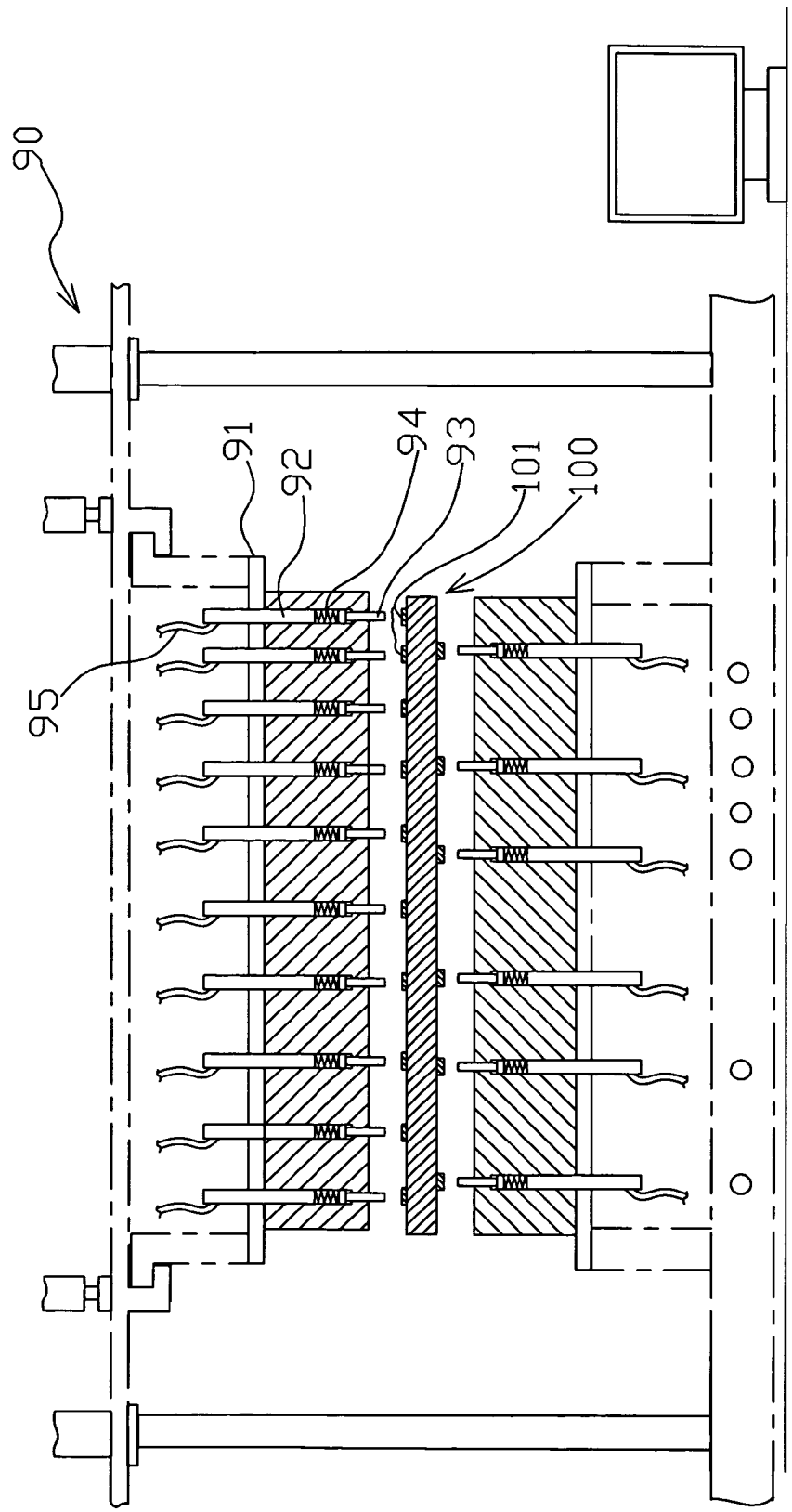
FIG. 1 is a schematic view of a conventional printed circuit board testing tool.
Figure 2:
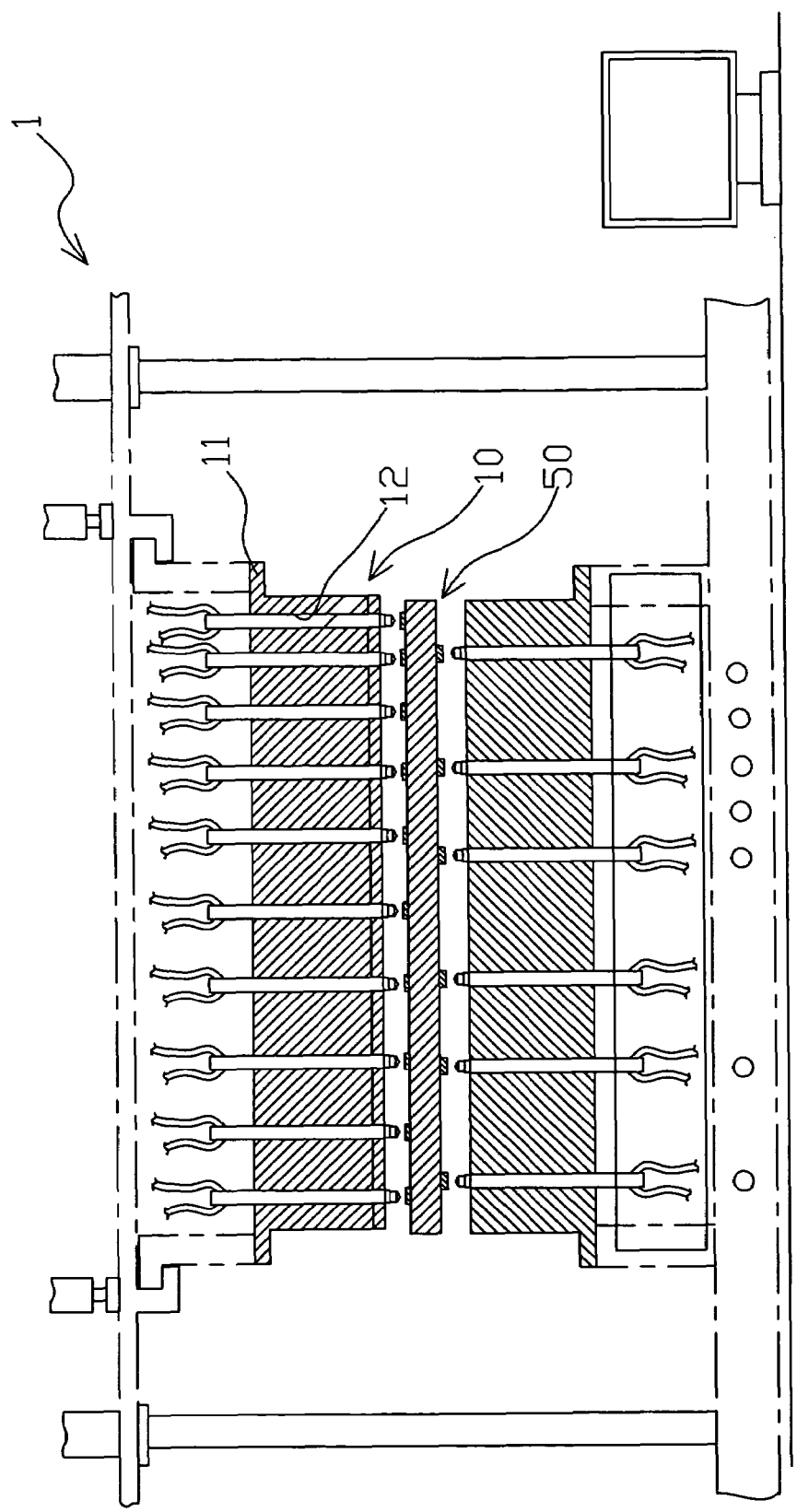
FIG. 2 is a schematic view of a testing machine of the present invention.

With reference to FIG. 2, a precision printed circuit board testing tool of the invention comprises a tool device 10, installed on a testing machine 1, for testing an open/short circuit (OPEN/SHORT) and a micro resistance of a printed circuit board 50, wherein the testing machine 1 includes a corresponding testing base 11 for installing a plurality of tool chambers 12 of the tool device 10, such that the tool device 10 facilitates the printed circuit board 50 to perform a testing of circuits.

Figure 3:
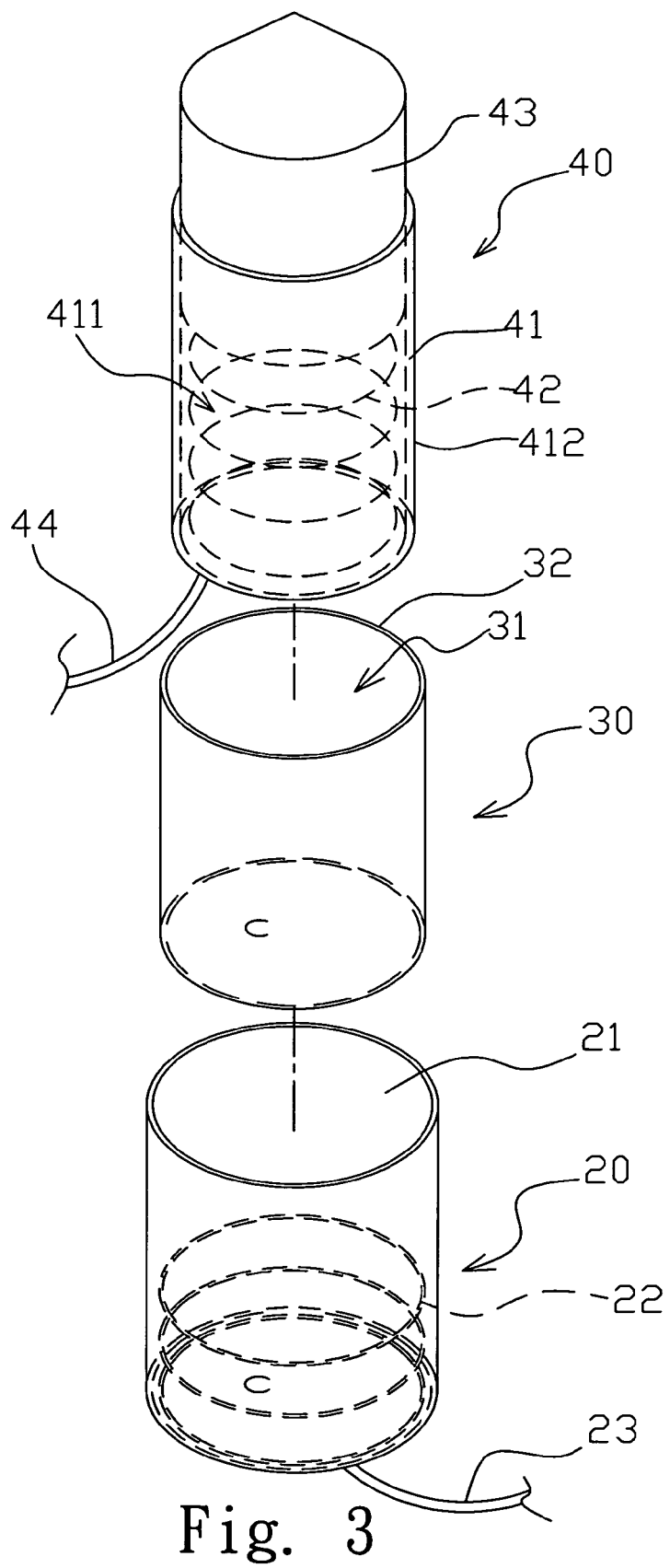
FIG. 3 is a schematic view of a testing device of the present invention.
Figure 4:
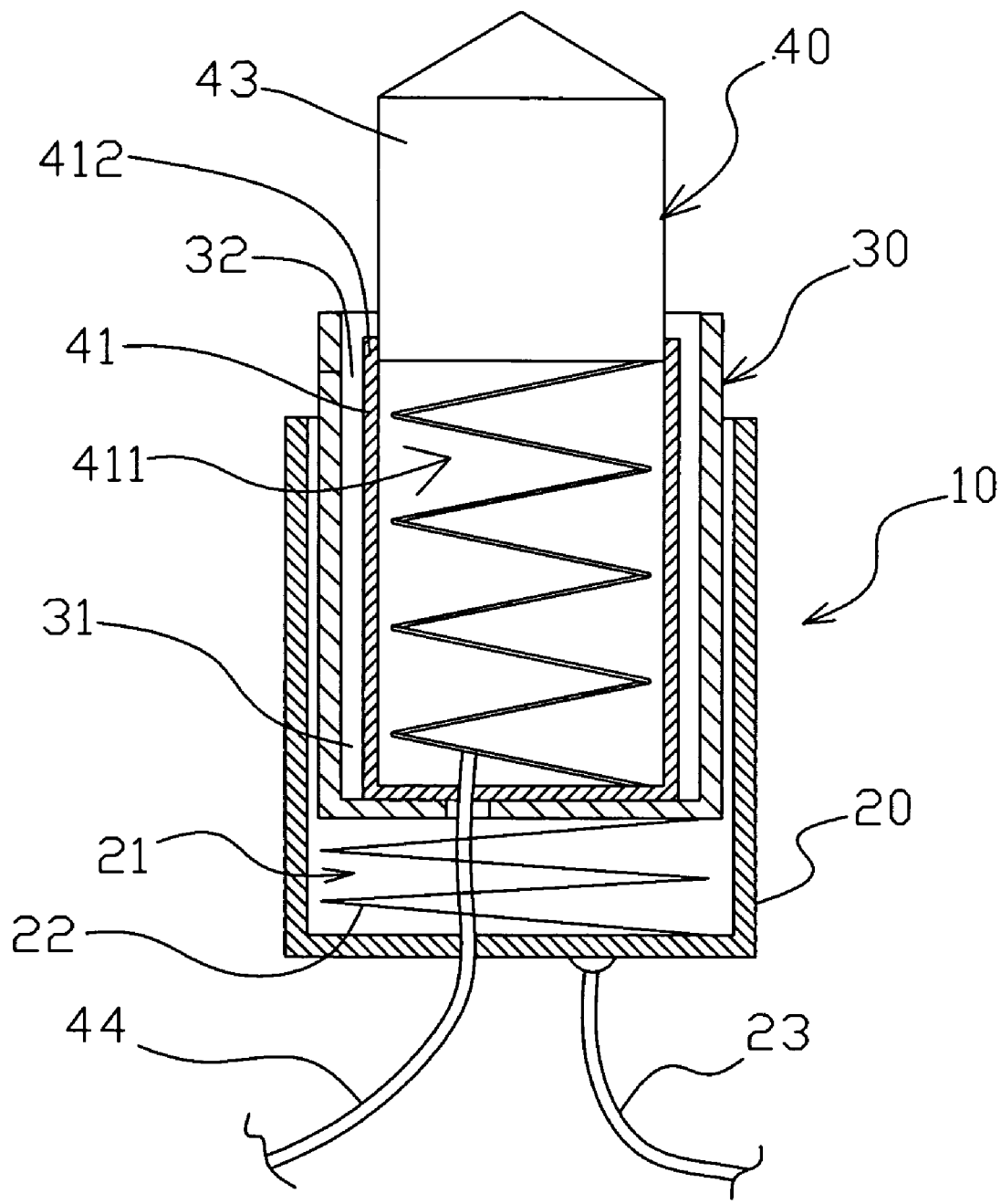
FIG. 4 is a perspective view of a testing device of the present invention.

With reference to FIGS. 3 and 4, the tool device 10 includes a testing tube 20, a second testing element 30 and a first testing element 40, and the testing tube 20 is disposed in a tool chamber 12 of the testing base 11 (not shown in the figure) and includes a cylindrical body of a hollow chamber 21, and the hollow chamber 21 includes a second resilient element 22 (such as a spring), and the testing tube 20 is connected to a second testing line 23. The second testing element 30 includes a second chamber 31 and an opening 32 (such as a bushing), and the second testing element 30 is installed in the hollow chamber 21 of the testing tube 20 and pressed against by the second resilient element 22 to contract/extend in the testing tube 20. In an appropriate mechanical design, the second testing element 30 is disposed in the testing tube 20, without being pressed against by the second resilient element 22 and separated from the testing tube 20. The first testing element 40 includes an internal bushing 41, a first resilient element 42 and a probe 43, and the internal bushing 41 is disposed in the second chamber 31 of the second testing element 30, and the internal bushing 41 includes a first chamber 411, and the external periphery of the internal bushing 411 includes an insulating layer 412 that provides an insulating effect, such that the internal bushing 41 and the second testing element 30 are insulated from each other. The first resilient element 42 (such as a spring) is installed in the first chamber 411 of the internal bushing 41, and the probe 43 is installed in first chamber 411 of the internal bushing 41, pressed against by the first resilient element 42, and protruded out from the opening 32 of the second testing element 30, such that the probe 43 can be contracted or extended in the internal bushing 41. In an appropriate mechanical design, the probe 43 is disposed in the internal bushing 41 without being pressed against by the first resilient element 42, and separated from the internal bushing 41. Further, the first testing element 40 is connected to a first testing line 44.

Figure 5:
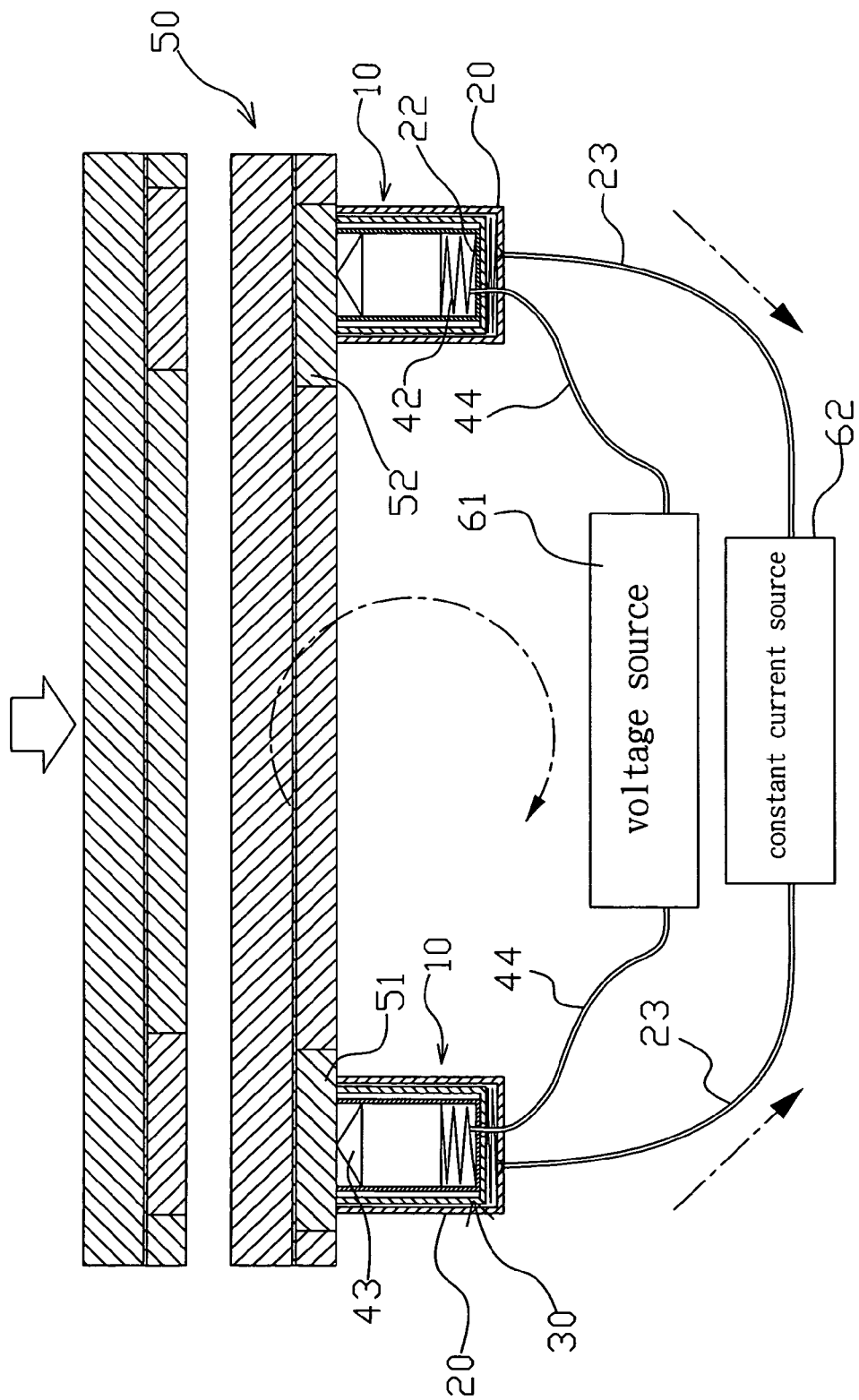
FIG. 5 is a schematic view of performing a testing operation by a tool device of the present invention.
Figure 6:
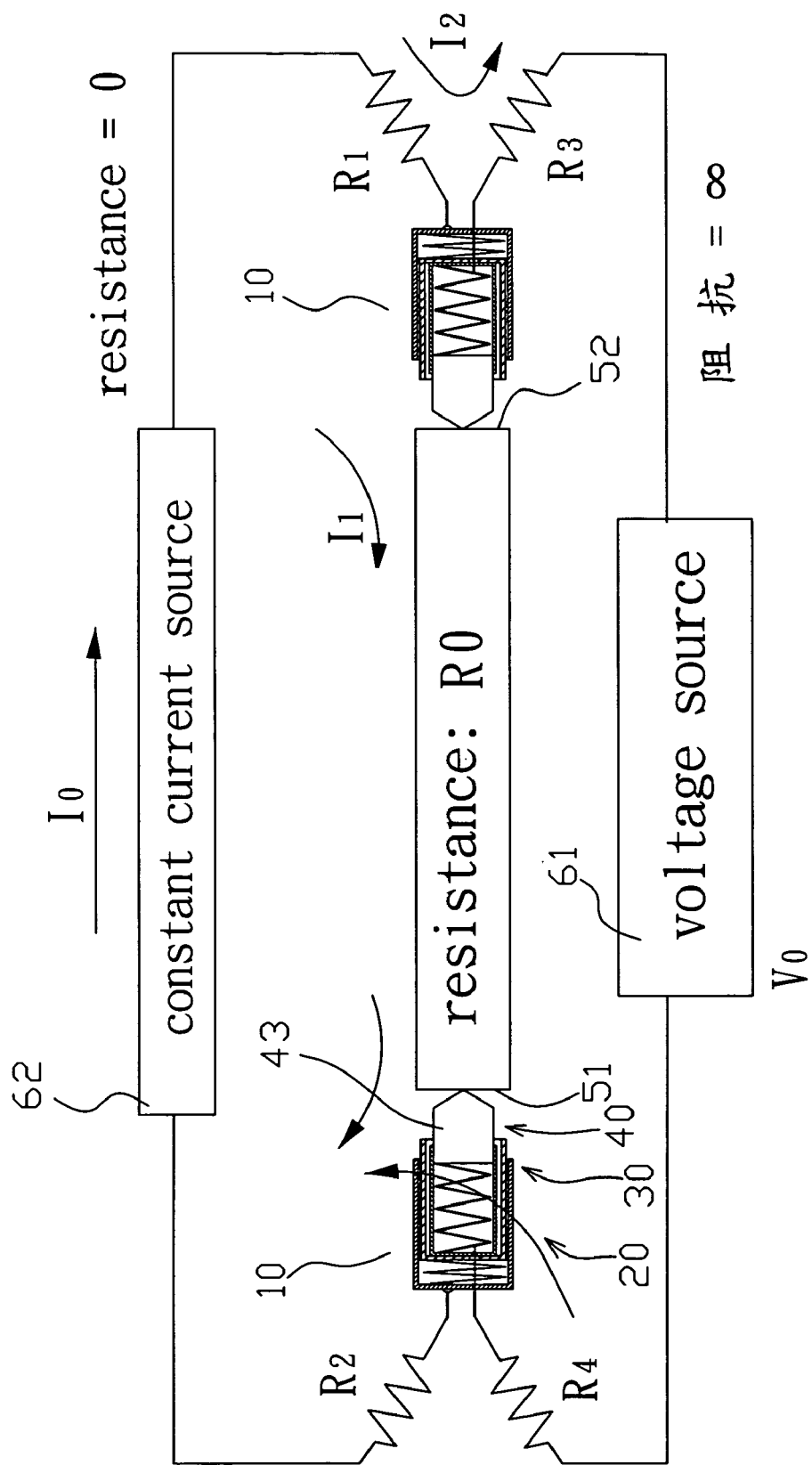
FIG. 6 is a schematic view of a circuit for performing a testing operation by a tool device in accordance with the present invention.

With reference to FIG. 5 for an operation of the precision printed circuit board testing tool in accordance with the present invention, two adjacent tool devices 10 are used for performing a circuit test between two conductive pads 51, 52, of the printed circuit board 50, and the first testing line 44 of the two tool devices 10 is connected to a voltage source 61 (such as a voltmeter), and the second testing line 23 of the two tool devices 10 is connected to a constant current source 62. In FIG. 6, if the printed circuit board 50 is pressed down, the probe 43 of the first testing element 40 and the second testing element 30 press the first resilient element 42 and the second resilient element 22 down respectively. Since the probe 43 and the second testing element 30 are in contact with the conductive pads 51, 52 of the printed circuit board 50 simultaneously, a 4-wire connection can be used for testing the resistance, so as to achieve a precise micro resistance testing effect, and precisely determine whether or not a circuit between two conductive pads 51, 52 of the printed circuit board 50 is normal.

In the foregoing testing method, if the tool device 10 is pressed down to contact the conductive pads 51, 52 of the printed circuit board 50, a similar testing effect can be achieved.

With reference to FIG. 6 for the operation of using a 4-wire connection for testing resistance, the constant current source 62 provides a current I0, and the voltage source 61 (such as a voltmeter) measures a voltage value V0 as shown in the figure:

Since $I0 = I1 + I2$ (Resistance=$\infty$)

Therefore, $I2 = 0$ $I0 = I1$

The 4-wire connection method is used for testing the resistance as follows:

$$V0 = (r3 + r4) \times I2 + I1 \times R0$$

$$V0/I0 = R0$$

Therefore, the resistance value of a circuit between the conductive pads 51, 52 can be obtained to determine whether or not the circuit is normal.

The major characteristic of the invention is the aforementioned design that complies with the application of using a 4-wire connection for testing resistance and achieves a precise and accurate testing of a circuit of a printed circuit board with a low resistance and a micro resistance, so as to overcome the shortcoming of the conventional testing tools, while avoiding misjudgments of a defective printed circuit board, and losses incurred by installing electronic component modules onto a defective printed circuit board.

In summation of the description above, the present invention enhances over the prior art and complies with the patent application requirements, and thus is duly filed for patent application. While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A precision printed circuit board testing tool, comprising:
a testing tube, including a hollow chamber, and a second resilient element contained in said hollow chamber, and said testing tube being electrically coupled to a second testing line;
a second testing element, installed in said hollow chamber of said testing tube, and including a second chamber and an opening, and said second testing element being pressed against by said second resilient element; and
a first testing element, including an internal bushing, a first resilient element and a probe, and said internal bushing being disposed in said second chamber, and said internal bushing including a first chamber, and said first resilient element being installed in said first chamber, and said probe being installed in said first chamber and pressed against by said first resilient element, and said first testing element being electrically coupled to a first testing line.

2. The precision printed circuit board testing tool according to claim 1, wherein said first resilient element and said second resilient element are springs respectively.

3. The precision printed circuit board testing tool according to claim 1, wherein said second testing element is a bushing.

4. The precision printed circuit board testing tool according to claim 1, wherein said internal bushing and said second testing element are insulated from each other.

5. The precision printed circuit board testing tool according to claim 1, wherein said internal bushing has an insulating external periphery.

6. The precision printed circuit board testing tool according to claim 1, wherein said first testing line is connected to a voltmeter.

7. The precision printed circuit board testing tool according to claim 1, wherein said second testing line is connected to a constant current source.

8. The precision printed circuit board testing tool according to claim 1, wherein said testing tube includes a hollow chamber, and second resilient element installed in said hollow chamber.

9. The precision printed circuit board testing tool according to claim 8, wherein said tool device further comprises a second testing element installed in said hollow chamber of said testing tube, and said second testing element includes a second chamber and an opening, and said second testing element is pressed against by said second resilient element.

10. The precision printed circuit board testing tool according to claim 9, wherein said first testing element includes an internal bushing, a first resilient element and a probe, and said internal bushing is disposed in said second chamber, and said internal bushing includes a first chamber installed in said first chamber, and said probe is installed in said first chamber and pressed against by said first resilient element.

11. The precision printed circuit board testing tool according to claim 10, wherein said first resilient element and said second resilient element are springs respectively.

12. The precision printed circuit board testing tool according to claim 9, wherein said second testing element is a bushing.

13. The precision printed circuit board testing tool according to claim 10, wherein said internal bushing and said second testing element are insulated from each other.

14. The precision printed circuit board testing tool according to claim 10, wherein said internal bushing has an insulating external periphery.

15. A precision printed circuit board testing tool, comprising:
- two tool devices, each including a testing tube electrically coupled to a second testing line;
- a first testing element, installed in said testing tube, and electrically coupled to a first testing line;
- a voltmeter, connected to said two first testing lines separately;
- a constant current source, connected to said two second testing line separately; and
- a printed circuit board, comprising two conductive pads, conductively and respectively connected to said two tool devices.

* * * * *